United States Patent [19]

Ouellet

[11] Patent Number: 5,447,613
[45] Date of Patent: Sep. 5, 1995

[54] PREVENTING OF VIA POISONING BY GLOW DISCHARGE INDUCED DESORPTION

[75] Inventor: Luc Ouellet, Granby, Canada

[73] Assignee: Mitel Corporation, Kanata, Canada

[21] Appl. No.: 78,166

[22] PCT Filed: Dec. 18, 1991

[86] PCT No.: PCT/CA91/00448

§ 371 Date: Jun. 21, 1993

§ 102(e) Date: Jun. 21, 1993

[87] PCT Pub. No.: WO92/11653

PCT Pub. Date: Jul. 9, 1992

[30] Foreign Application Priority Data

Dec. 20, 1990 [CA] Canada ................................ 2032763

[51] Int. Cl.6 .......................................... C23C 14/10
[52] U.S. Cl. ............................ 204/192.1; 204/192.12; 204/192.22; 204/192.23
[58] Field of Search ........... 204/192.3, 192.25, 192.23, 204/192.22, 192.12, 298.09, 298.25, 298.35; 437/231

[56] References Cited

U.S. PATENT DOCUMENTS

| | | | |
|---|---|---|---|
| 3,661,747 | 5/1972 | Byrnes, Jr. et al. | 204/192.23 |
| 4,722,298 | 2/1988 | Rubin et al. | 204/298.25 |
| 4,731,293 | 3/1988 | Ekholm et al. | 204/192.25 |
| 4,816,638 | 3/1989 | Ukai et al. | 204/298.35 |
| 4,909,314 | 3/1990 | Lamont, Jr. | 204/298.09 |

OTHER PUBLICATIONS

Paul E. Riley and Attila Shelley, "Characterization of a Spin -Applied Dielectric for Use in Multilevel Metallization" May 1988 pp. 1207–1210.

Primary Examiner—R. Bruce Breneman
Assistant Examiner—Rodney G. McDonald
Attorney, Agent, or Firm—Marks & Clerk

[57] ABSTRACT

A method of fabricating multilevel semiconductor wafers including a spin-on glass planarization layer is described. Prior to sputtering of the interconnect layer and after application of the spin-on glass layer, the wafer is exposed to an intense glow discharge in such a way that it is bombarded in at least a partial vacuum with ions and/or electrons and/or photons while at a temperature that is between 400° C. and 550° C. and that is at least 25° C. higher than the temperature to which the wafer is to be subjected during the subsequent sputtering step. In this way undesirable molecules can be desorbed from the spin-on glass layer so that they do not interfere with the subsequent sputtering step.

11 Claims, 2 Drawing Sheets

PREVENTING OF VIA POISONING BY GLOW DISCHARGE INDUCED DESORPTION

BACKGROUND OF THE INVENTION

This invention relates to the fabrication of semiconductor devices, and more particularly, but not exclusively, to a method of fabricating semiconductor wafers wherein spin-on glass (SOG) is applied to the semiconductor substrate as a planarization layer during the fabrication process.

Spin-on glasses (SOGs) are proprietary liquid solutions containing silicate (purely inorganic SOGs) or siloxane (quasi-inorganic SOGs) based monomers diluted in various kinds of solvents or alcohols. Such solutions are available from Allied Signal Inc., Milpitas, Calif. During coating and curing, the monomers are polymerized by condensation of silanol and ethoxy groups. Water vapour, ethyl alcohol, and other by-products such as ethylene, are released according to the following scheme:

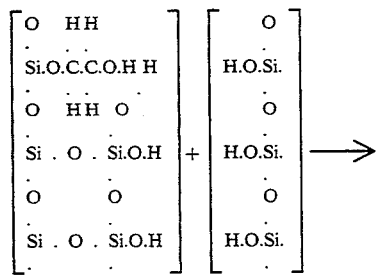

Polymerization of the SOG solution stops when the distance between neighboring silanol groups, or ethoxy groups, becomes too large, or when too much condensation gas such as water vapour, ethyl alcohol, or its decomposition by-products, ethylene, and water vapour, blocks the condensation mechanism. Heating is then needed to eliminate these gases and permit further condensation, densification, and the fabrication of a hard purely inorganic or quasi-inorganic SOG film.

The final density of the obtained SOG films depends on many factors, but it is generally lower than the density of other inorganic or quasi-inorganic glasses deposited by other commonly used techniques such as LPCVD or PECVD. This lower density is due to the large number of pores in the SOG film, which cause high conductance paths between film surface and its bulk.

These pores permit readily adsorbed gas molecules present on SOG film surface to continuously and rapidly diffuse through the bulk of the film and rapidly physically connect to the glass by forming low energy (<0.3 eV) Van der Waals bonds ( . . ). The gas molecules are rapidly physically absorbed by the SOG film network.

Some gases, such as water vapour, have molecules that can slowly form high energy (>0.5 eV) chemical bonds (.) with the SOG film network by forming a pair of silanol groups. Water vapour molecules are slowly chemically absorbed by the SOG film network as shown below:

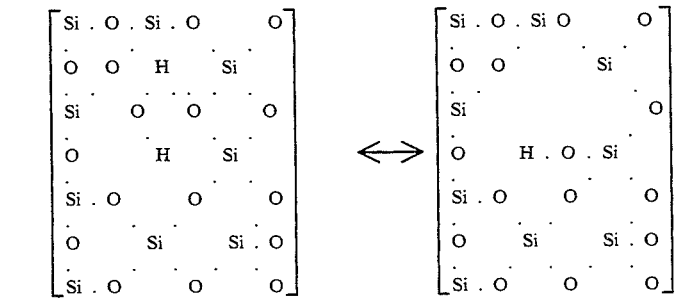

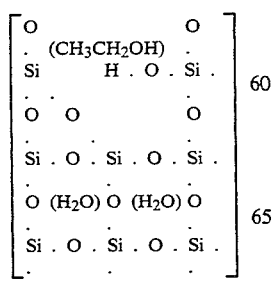

This slow chemical absorption of water vapour by the SOG film is particularly efficient if the SOG solution contains phosphorus organometallic molecules, which provide very efficient water vapour gettering due to the presence of phosphorus-oxygen double bounds in the SOG film:

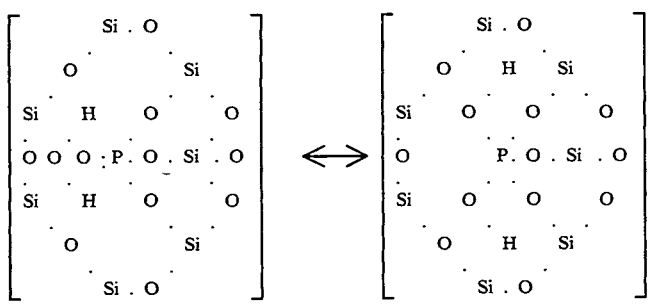

The gettering of water vapour by absorption can be verified by infrared spectroscopy by monitoring the behaviour of these P:O bonds and other bonds in presence of moisture. Infrared spectroscopy shows that readily adsorbed water vapour molecules rapidly diffuse in the pores of the SOG, rapidly become physically absorbed (3350 cm$^{-1}$), and slowly become chemically absorbed by —P:O bonds (1280 cm$^{-1}$) and —Si.O.Si— bonds (460, 810, 1070 and 1140 cm$^{-1}$) to form respectively —P.OH (950 and 3700 cm$^{-1}$) and —Si.OH (930 and 3650 cm$^{-1}$) groups.

The rapid physical absorption is characterized by a $t^{\frac{1}{2}}$ behaviour and the slow chemical absorption is characterized by a $t^{\frac{1}{4}}$ behaviour.

The same mechanism is observed for glasses other than spin-on glasses and has been reported for very low temperature, thus very porous, LPCVD and PECVD silicates [See W. A. Pliskin, J. Vac. Sci. Technol., Vol. 14, p. 1064.; J. A. Theil, D. V. Tsu, G. Lucovsky, Journal of Electronic Materials, Vol. 19, No. 3, pp. 209-217].

It is believed that this mechanism is universal and should be observed for any type of porous glass. It is also believed that the lower the film porosity, which implies fewer pores and lower conductance from the film surface to its core, the slower the water vapour channeling, its physical absorption and chemical absorption.

Since the cure temperature of SOG used to smooth glasses in a non etch-back SOG multi-level interconnect process is limited to less than 550° C., and since SOG is more porous than the surrounding LPCVD or PECVD glass, it physically adsorbs more water vapour, as bonded H$_2$O, and chemically adsorbs more of it, as .SiOH groups, than its equivalent volume of denser PECVD or LPCVD glass.

If these SOG or LPCVD or PECVD glasses incorporate phosphorus, water vapour can also be chemically absorbed as .POH groups.

If the condensed ethyl alcohol, is not eliminated from the SOG during curing, it can slowly react chemically with the network and form a silanol pair.

The presence of water vapour, ethyl alcohol, and its decomposition by-products in the SOG, as well as in very low temperature LPCVD and PECVD glasses, can cause serious manufacturing problems, such as via poisoning, poor metallization step coverage, dielectric cracking and blistering, as well as reliability problems, such as via corrosion, stress migration, electromigration, transistor threshold voltage instability problems, and hot electron effects, in the finished device.

In the manufacture of multilevel integrated circuits, it is important to ensure complete desorption of adsorbed as well as physically and chemically absorbed water vapour and ethyl alcohol from the SOG just prior to deposition of the second level of interconnect material. This metal based interconnect material covers the top, sidewall and bottom of the SOG exposed via and, in combination with a layer of dense LPCVD or PECVD dielectric that protects the SOG in a non etch-back SOG process, prevents readsorption and reabsorption of water vapour and other ambient gases by the SOG.

An important side benefit of a SOG layer that is completely free of water vapour and ethyl alcohol is that the obtained device then incorporates an integrated gettering material. The dry SOG ensures improved reliability against water vapour penetration up to the device active transistors during highly accelerated stress testing (HAST), temperature and humidity bias testing (THB), other reliability testing, and in the field.

It has been shown that it is possible to ensure desorption of adsorbed, physically absorbed and chemically absorbed water vapor and to leave SOG pores under vacuum before capping the SOG layer by the deposition of dense and protective LPCVD or PECVD dielectric. It has also been shown that the exposure of SOG layer to ambient occurs after via opening and that water vapour readsorption and physical reabsorption occur rapidly while chemical reabsorption occurs more slowly.

Fabrication of semiconductor devices using non etch-back purely inorganic spin-on glass processes typically requires batch type metallization equipment and very short delays between via etching, post via etch photoresist stripping, post stripping inspection, and via metallization itself. This process uses tightly controlled ambient dry boxes for wafer storage if extended periods are needed between these steps; this avoids slow chemical absorption of water vapour by the exposed SOG.

Just prior to entering the metallization equipment, a pre-metallization water vapour desorption step may be performed in an independent vacuum or dry ambient batch system for an extended period of more than about 30 minutes and at a temperature as high as about 450° C. The re-exposure to ambient air causes quick surface readsorption and physical reabsorption of water vapour, while the slow chemical reabsorption of water vapour is prevented due to a too short re-exposure time; the longer the SOG film exposure to ambient air, the more chemically water vapour is absorbed.

An optional in-situ pre-metallization desorption step of adsorbed and physically absorbed water vapour in the load-lock or in the main chamber of the sputtering system may be performed. This is done at relatively low temperature, typically between 250° and 400° C. This batch desorption step is normally not possible in single wafer sputtering equipment, and this explains why single wafer sputtering equipment is normally not used for such a process. If this desorption step is done in the main sputtering chamber, shuttered target sputtering is necessary to ensure cleaning of the targets contaminated by desorption gases. Chemically absorbed species of activation energies exceeding about 2.00 eV are then not eliminated normally. The desorption efficiency is a direct function of the in-line cure cycle on the SOG processor [TAZMO], and the use of standard 250° C. hot plates instead of specially made 350° C. hot plates causes the accumulation of larger quantities of chemically absorbed organic molecules and imposes higher desorption temperature than 400° C.

A sputter etch cycle is typically performed in the main sputtering chamber to sputter clean the undesirable silicon oxide or aluminum oxide thin film covering the silicon or aluminum surface to interconnect with the material to deposit. This step is done at room temperature or at a non controlled and relatively low temperature. The wafer temperature rises during sputter cleaning because of a poor thermal contact to the backing plane. Desorption gases produced by this uncontrolled temperature rise and this glow discharge exposure can cause problems for oxide removal and can in fact contribute to an increase of the oxide thickness. This problem is a very serious one for small diameter vias that are needed for the new generation of devices.

The deposition of selective or blanket tungsten or other interconnect materials by plasma enhanced chemical vapour deposition, PECVD, exhibits the same problem of glow discharge induced desorption since these processes also use glow discharges for the deposition of the interconnect material.

SUMMARY OF THE INVENTION

An object of the present invention is to alleviate the aforementioned disadvantages of the prior art.

According to the present invention there is provided a method of fabricating multilevel semiconductor wafers including a spin-on glass planarization layer, wherein prior to sputtering of the interconnect layer and after application of the spin-on glass layer, the wafer is exposed to an intense glow discharge in such a way that it is bombarded in at least a partial vacuum with ions and/or electrons and/or photons while at a temperature that is between 400° C. and 550° C. and that is at least 25° C. higher than the temperature to which the wafer is be subjected during the subsequent sputtering step so as to desorb undesirable molecules from the spin-on glass layer.

The method according to the invention permits in-situ desorption of adsorbed, physically absorbed, as well as chemically absorbed molecules by the simultaneous use of controlled high temperature and glow discharge cleaning. This in-situ desorption can be done in the sputtering system itself, in its load-lock, or in a dedicated chamber of a cluster tool. The obtained process, its yield and the reliability of the completed devices are then not sensitive to wafer history. The process can eliminate the via poisoning problem, even at small geometries.

The glow discharge preferably takes place in a magnetic field to intensify the discharge near the wafer and maximize the electron, photon, and/or ion densities.

Preferably, single wafer sputtering equipment is used to ensure high throughput, high uniformity and precisely controlled high temperature and high bias metallization of aluminum alloys, as well as Ti and W containing alloys and compounds. It is also necessary to provide desorption of adsorbed, physically absorbed and chemically absorbed water vapour, ethyl alcohol and its decomposition by-products from SOG before depositing the second level of interconnect material in-situ in such single wafer sputtering equipment. The in-situ desorption of water vapour, ethyl alcohol and its decomposition by-products should be done using a single wafer hot plate so as to perfectly control wafer temperature. Desorption of the water vapour, ethyl alcohol and its decomposition by-products should be carried out rapidly so as to maintain a production compatible throughput of a non etch-back spin-on glass process for the interconnection of high performance and high density multi-level metallization CMOS devices. The use of an argon pressurized back side wafer hot plate gives a much better thermal contact between the heating hot plate and the wafer and permits the wafer to reach, within less than 30 seconds, a temperature that is very close to the chuck temperature. The adsorbed water vapour and other gases at the surface are readily eliminated during vacuum pump-down at room temperature.

Vacuum heating at about 150° C. is sufficient to quickly remove physically absorbed non-polar gases like nitrogen, oxygen, carbon dioxide, as well as polar molecules such as water vapour, and ethyl alcohol. Vacuum heating at a temperature exceeding about 400° C. is necessary to permit desorption of chemically absorbed water vapour as a double silanol pair, and ethyl alcohol as an ethoxy-silanol pair. As condensation occurs between neighboring silanol, ethoxy, or .POH groups, the statistical distance between residual groups increases and the desorption rate of water vapour, and ethyl alcohol, and its decomposition by-products eventually becomes negligible, at that temperature.

A desorption time of about three minutes is long enough to obtain a negligible desorption rate of water vapour, ethyl alcohol, and its decomposition by-products, at that temperature. An increase of that temperature increases desorption of water vapour, ethyl alcohol and its decomposition by-products, by permitting longer overlap and more efficient condensation of .SiOCH$_2$CH$_3$, .POH or .SiOH groups, thus causing desorption rate of water vapour, ethyl alcohol, and its decomposition by-products to increase and eventually drop, at that increased temperature, If the new temperature is high enough, condensation of most if not all of the available .SiOCH$_2$CH$_3$, .POH and .SiOH groups occurs and the SOG film becomes free of water vapour, ethyl alcohol, and decomposition by-products. Independently of the desorption temperature, this temperature must exceed by at least 25° C. the highest metallization temperature to which the surface of the wafer will be exposed during metallization. The wafer desorption temperature should not exceed about 550° C. to minimize hillock growth, junction spiking and films cracking problems. This technique permits the reduction of die size of multi-level interconnect devices by reducing via dimensions due to an improved via desorption efficiency which reduces interconnect material oxidation and specific contact resistance. It also permits the manufacturing of better yield and more reliable multi-level interconnect CMOS devices, and prevents the specification of tightly controlled delays between manufacturing steps, the use of so well controlled dry boxes for the storage of partly processed devices, and improves the process flow by reducing constraints.

BRIEF DESCRIPTION OF THE DRAWINGS

The invention will now be described in more detail, by way of example only, with reference to the accompanying drawings in which.

DESCRIPTION OF THE PREFERRED EMBODIMENTS

Figure 1A:
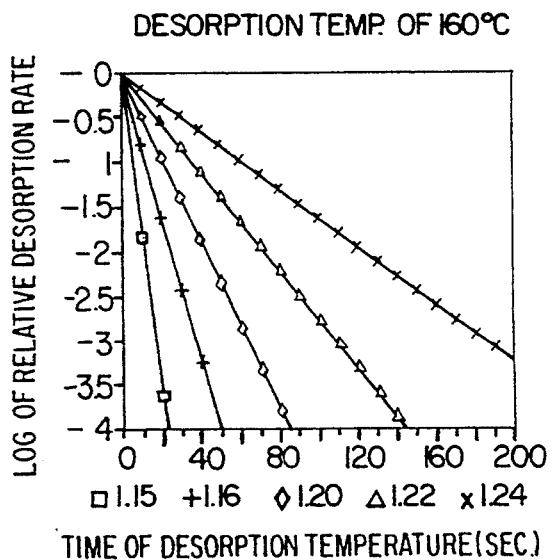
FIGS. 1a to 1d show graphs of desorption rate as a function of activation energy, desorption temperature and time for different desorption temperatures.
Figure 1B:
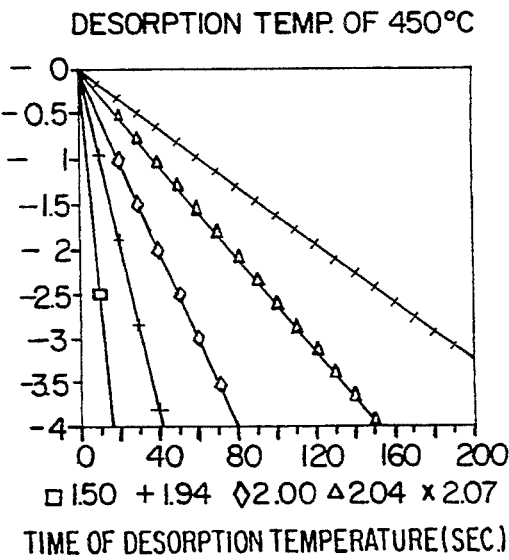
Figure 1C:
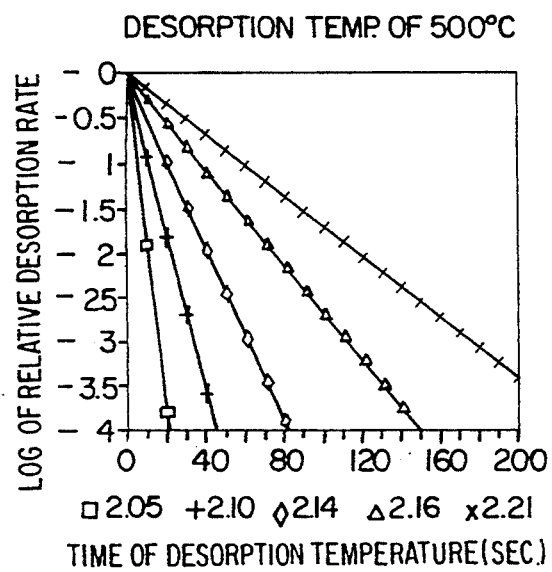
Figure 1D:
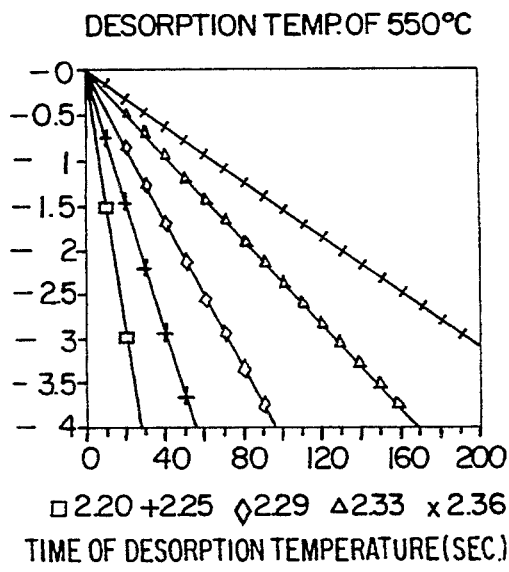

The relationship between binding energy, Ea, and temperature, Tm, at which maximum desorption occurs is given by the expression:

$$\frac{Ea}{kTm2} = \frac{\alpha}{\beta} \exp\left[\frac{-Ea}{kTm}\right] \quad (1)$$

where k is Boltzman's constant, $\alpha$ is the rate constant ($\approx 10^{11} s^{-1}$), and $\beta$ is the rate of change of sample temperature.

If the desorption temperature is raised rapidly to a certain equilibrium desorption temperature, T, it is possible to estimate the dynamic desorption rate, R(t), associated with the desorption mechanism of previously calculated activation energy, Ea, at any time after this equilibrium temperature is reached.

$$R(t) = R_o \exp\left[-\alpha \exp\left[\frac{-E_a}{kT}\right]t\right] \quad (2)$$

where $R_o$ is the desorption rate immediately after reaching this equilibrium temperature.

When the temperature of a wafer under vacuum is raised at a specific rate, it is possible to quantify thermally stimulated desorption by monitoring the partial pressure of the various gaseous species as a function of the wafer temperature. Desorption peaks are observed at temperature $T_{p1}$, $T_{p2}$, ..., and $T_{pn}$. The equation permits the activation energies $E_{a1}$, $E_{a2}$, ..., and $E_{an}$ associated with the desorption of these species to be calculated.

From a knowledge of these activation energies, equation (2) can be used to generate the desorption rate versus time graphs for various equilibrium desorption temperatures and these activation energies.

Since quick desorption times of the order of three minutes are desirable to maintain high throughput single wafer pre-metallization desorption of adsorbed, physically absorbed, as well as chemically absorbed gases, it is necessary to limit the desorption time to about 200 seconds and to estimate the desorption rates during this period.

These desorption rates can be normalized by the initial desorption rate which is obtained immediately after reaching the equilibrium desorption temperature at time zero.

Being exponential in nature, these decreasing adsorption desorption rates appears linear on semi-logarithmic scales. A four decade decrease, representing a 99.99% completed desorption, is used for the purpose of generating the graphs shown in FIG. 1. Desorption temperatures of 160°, 450°, 500° and 550° C. are used in these examples.

The various gas species that physically and chemically desorb from inorganic spin-on glasses when these are exposed to high temperatures under vacuum are nitrogen, oxygen, hydrogen, carbon dioxide, carbon monoxide, water vapour, ethyl alcohol, and ethylene.

Nitrogen originates from ambient nitrogen physically absorbed in the pores. Oxygen originates from ambient exposure and from abnormal silanol-silanol condensation which result in the formation of a silicon-silicon bonding. Hydrogen is also obtained by this condensation. Hydrogen originates from an ambient exposure and from an abnormal silanol-silanol condensation which result in the formation of a silicon-oxygen-oxygen-silicon bonding. It also originates from an abnormal silanol-silanol condensation which result in the formation of a silicon-silicon bonding. Oxygen is also formed in this case. Carbon dioxide and carbon monoxide originate from an ambient exposure and from the oxidation of residual solvents, ethyl alcohol, or ethylene. Water vapour is also formed in this case. Water vapour originates from an ambient exposure, from a silanol-silanol condensation, or from the ethyl alcohol thermal decomposition which also forms ethylene. It is also originates from the oxidation of residual solvents, ethyl alcohol or ethylene. Carbon dioxide and carbon monoxide are also formed in that case. Ethyl alcohol originates from the SOG solution itself, as a residual solvent physically absorbed in the pores, or from an ethoxy-silanol condensation. Ethylene originates from the thermal decomposition of ethyl alcohol. Water vapour is also formed as a by-product of this decomposition.

Each of the above gas formation and desorption mechanisms is characterized by an activation energy. These activation energies are estimated. The activation energies for the desorption of physically adsorbed non polar molecules like nitrogen, $N_2$, oxygen, $O_2$, hydrogen, carbon dioxide, ethylene, and very slightly polar molecules like carbon monoxide, are very low since these molecules only interacts with the SOG surface by Van der Waals forces. In that case, the desorption activation energies are less than about 0.10 eV.

The activation energies for the thermal diffusion of such non polar molecules through the pores of the SOG up to the surface, thus resulting in the desorption of physically absorbed such non polar molecules of small diameter, are also very low since these molecules only interact with the SOG pores by these low energy Van der Waals forces, and since their average diameter is much smaller than typical pore diameter, which is known to be about 2–3 nm. In that case, the desorption activation energies are less than about 0.25 eV.

The activation energy for the desorption of physically adsorbed water vapour is higher than the one for non polar molecules because these polar molecules can bond to the SOG surface due to dipole-dipole interactions which are known to be more energetic than the Van der Waals forces.

This activation energy for the thermal desorption from the SOG surface must be smaller than the one for its thermal diffusion through the pores of the SOG up to the surface, thus resulting in the desorption of physically absorbed water vapour. This diffusion is more difficult than the one of non polar molecules because water vapour molecules are polar and can bond to the SOG pores by dipole-dipole interactions. Water vapour diffusion in inorganic spin-on glasses is known from the literature to be about 0.50 eV. Being more volatile than water vapour, the activation energy for the desorption of physically adsorbed ethyl alcohol is expected to be lower than the one of water vapour and should not exceed about 0.30 eV.

The activation for the thermal diffusion of polar ethyl alcohol through the pores of the SOG up to the surface, thus resulting in the desorption of physically absorbed ethyl alcohol, is higher than the one for water vapour because the diameter of an ethyl alcohol molecule is much larger than the one of a water molecule and its diffusion through small micro-pores is more difficult. Knowing that the desorption peak is at about 135° C., and that the temperature rise is about 55° C./min., equation (1) gives an activation energy of about 1.07 eV.

The activation energy associated with the desorption of ethylene produced from the thermal decomposition of physically absorbed ethyl alcohol is obtained by the calculation of its standard heat of formation, $\delta Hf^o$, from ethyl alcohol:

$$CH_3CH_2OH \rightarrow C_2H_4 + H_2O; \quad \delta Hf^o = -0.48 \text{ eV}$$

Thus ethyl alcohol thermally decomposes at relatively low temperature and its presence can be verified by the monitoring of simultaneous presence of water vapour and ethylene. Mass spectroscopy verifies simultaneous water vapour and ethylene formation in spin-on glasses. Ethylene presence was confirmed by comparing reported cracking pattern to the following published table:

| AMU | RELATIVE % |
| --- | --- |
| 28 | 100 |
| 27 | 59 |
| 26 | 61 |
| 25 | 12 |

The reported molecules at mass 18, 28 and 44 that were respectively identified as $H_2O$, CO and $CO_2$ should be in fact $H_2O$, $C_2H_4$ and a cracking pattern of $CH_3CH_2OH$. The desorption peak at about 25° C. shows thermal desorption of surface adsorbed ethyl alcohol, and the peak at 135° C. shows the thermal desorption of physically absorbed ethyl alcohol, resulting from its bulk diffusion through the network of micro-pores.

The activation energy associated with the desorption of ethyl alcohol produced from the condensation of an ethoxy group and a silanol group:

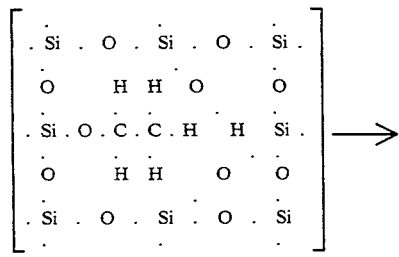

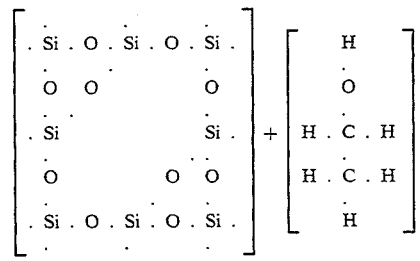

can be estimated. Knowing that the desorption peak is at about 360° C., and that the temperature rise is about 55° C./min., equation (1) gives an activation energy of about 1.68 eV. Of course, the formed ethyl alcohol molecule easily decomposes at that temperature and forms ethylene and water vapour, as shown by the simultaneous presence of a water vapour peak and an ethylene peak at 360° C.

In the latter case, ethyl alcohol was chemically bonded to the SOG network as a .SiOH—HOCH$_2$CH$_3$ pair. These .SiOEt groups are relatively easy to break. It is nevertheless possible for ethyl alcohol to be chemically absorbed by the SOG network by another bonding sequence:

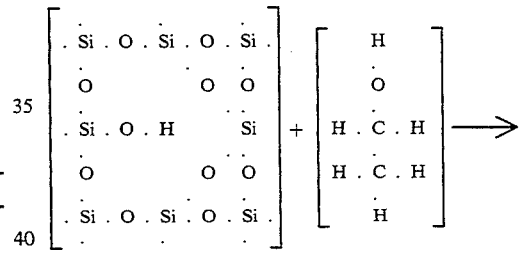

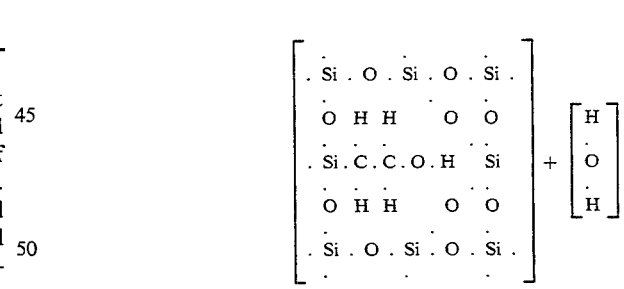

The activation energy associated with the desorption of ethyl alcohol produced from the condensation of a group and a silanol group:

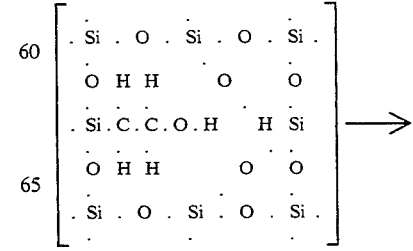

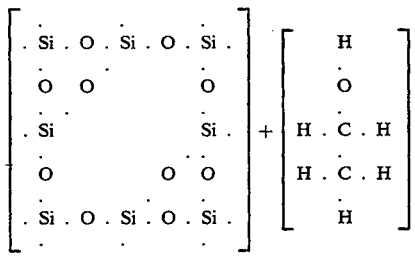

can be estimated. Knowing that the desorption peak is at about 480° C., and that the temperature rise is about 55° C/min., equation (1) gives an activation energy of about 2.00 eV. The formed ethyl alcohol molecule easily decomposes at that temperature and forms ethylene and water vapour, as shown by the simultaneous presence of a water vapour peak at 480° C.

Other chemical bonding sequences are possible between water vapour, ethyl alcohol, ethylene, and other solvents of the SOG solution and the SOG porous network.

Activation energies exceeding 2.00 eV are possible for the desorption of these chemically absorbed volatile gases and their decomposition by-products.

Disconnection of phosphorus oxide from the $SiO_2$ network is also possible at very high temperature due to destruction of .SiOP. bonds. Since phosphorus oxide is very volatile at relatively low temperature, desorption will occur.

The above description shows that desorption of most of the adsorbed, physically absorbed and chemically absorbed volatile species can occur at much lower temperature since their activation energies are lower than about 2.30 eV.

EXAMPLE

A 600 nm thick phosphorus doped purely inorganic spin-on glass, ACCUGLASS P-062A, was coated on a silicon wafer, cured at a temperature not exceeding 425° C., and protected by a 100 nm thick dense phosphosilicate (PSG) LPCVD film that prevents water vapour and other ambient gas re-absorption by the porous SOG. This film structure was analyzed by a very sensitive nuclear technique for light elements such as hydrogen and carbon: Elastic Recoil Detection (ERD). Sensitivity is about 0.1% atomic for these elements. The following table gives the results of the analysis:

|   | 100 nm TOP PSG | | 600 nm BOTTOM SOG | |
|---|---|---|---|---|
|   | Weight % | Atomic % | Weight % | Atomic % |
| O | 54.7 | 63.3 | 55.0 | 65.6 |
| Si | 42.5 | 28.2 | 42.7 | 29.2 |
| P | 2.3 | 1.4 | 2.0 | 1.2 |
| C | <0.1 | <0.1 | <0.1 | <0.1 |
| H | 0.4 | 7.0 | 0.2 | 3.9 |
| N | <0.1 | <0.1 | <0.1 | <0.1 |

This experiment shows that the hydrogen content of the SOG film is lower than the hydrogen content of the PSG film, and that the carbon content of the SOG film is smaller than the detection limit.

Figure 2:
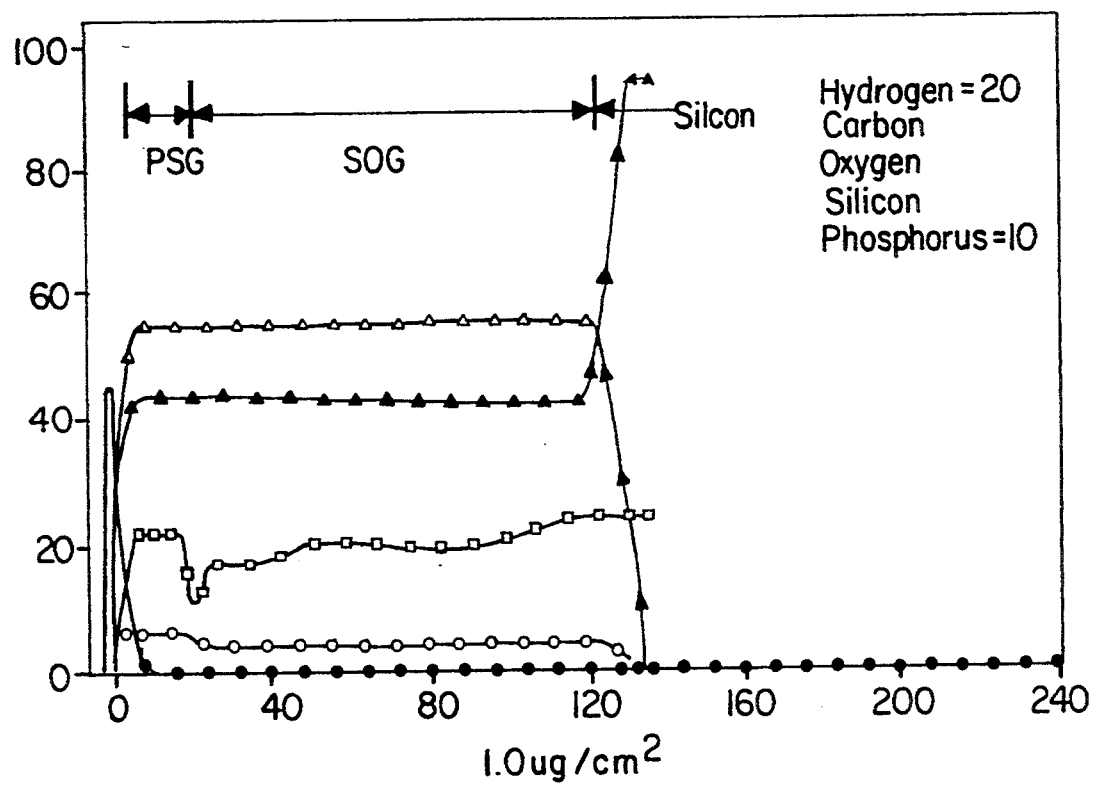
FIG. 2 shows the elastic recoil detection analysis of the elemental composition of a (100 nm PSG/600 nm SOG/Si) structure.

This experiment also confirms that most adsorbed and absorbed volatile gases were eliminated by a heat treatment at 425° C. and indicates that the SOG cure cycle was optimized. The element profile is given in FIG. 2.

Physically absorbed water vapour and ethyl alcohol eliminated by a heat treatment at a temperature lower than about 135° C. count for about 12 wt % of the spun SOG film. Chemically absorbed ethyl alcohol eliminated by a heat treatment at a temperature lower than about 450° C. counts for another 13 wt%.

Our copending Canadian patent application Ser. No. 2,009,518 discloses the use of an in-line 350° C. hot plate that permits the elimination of chemically bonded solvents, such as ethyl alcohol, between each of the successive thin coats forming the SOG film that smooths the dielectrics used for the manufacturing of semiconductor devices. This prevents the excessive accumulation of volatile gases at the bottom part of deep valleys and permits a more efficient elimination.

This complete elimination of organic volatiles, such as ethyl alcohol and ethylene, contradicts the prior art (see for example, R. A. M. Wolters, PROC. VMIC, 1990, pp. 447–449), which shows very substantial evacuation of organic materials at a temperature exceeding about 425° C.

The accumulation of organic materials in the SOG film under cure and the dynamics of organic materials as well as water vapour at high temperatures (>425° C.) are affected by the presence of a high temperature (350° C.) in-line hot plate between each successive coat of SOG.

Since standard [TAZMO] SOG processors use 250° C. in-line hot plates, and a temperature as high as 480° C. is required to completely eliminate the organic residues, standard SOGs need temperatures as high as about 475° C. to ensure equivalent desorption of absorbed organics.

The non-use of this higher temperature in-line hot plate imposes then a higher desorption temperature to ensure complete desorption of absorbed organics.

As described in copending Canadian patent application no. 2,017,719, filed May 19, 1991, the use of an argon pressurized back side wafer hot plate permits very efficient in-situ desorption of water vapour from porous dielectrics such as spin-on glasses and improved metal deposition because this heating approach permits quick response time for wafer temperature rise. Two hundred (200) seconds is about the maximum allowable time to simultaneously ensure complete desorption and high throughput.

The graphs in FIG. 1 show that desorption which calls for activation energies exceeding about 2.30 eV cannot be completed within that time period if wafer temperature is limited to less than about 550° C. during this necessary in-situ desorption step.

Desorption of most volatile species can actually occur at less than 425° C. if the in-line cure sequence is optimized and use is made of a higher than normal temperature in-line hot plate.

Volatile species desorb from porous dielectrics if the wafer temperature is raised to a temperature that exceeds the desorption temperature. This is because some condensation or decomposition mechanisms of higher activation energies prevent the absolute elimination of volatiles at any temperature.

An example of higher temperature desorption is the thermal decomposition of phosphosilicate glasses (PSG) to non volatile $SiO_2$ and high vapour pressure $P_2O_5$ that occur if energetic .SiOP. bonds are broken.

Another example is simply condensation of very large distance neighboring silanol and ethoxy groups.

A third example is the elimination of large residual volatile molecules through too small SOG micro-pores which necessitates excessive temperatures to form, by thermal decomposition, smaller molecules that can easily diffuse up to the surface.

The desorption of these molecules resulting from thermal decomposition or condensation mechanisms are characterized by activation energies that exceed about 2.30 eV because they do not completely occur at temperatures lower than about 550° C. The desorption of these molecules may occur if the material is exposed to a glow discharge at high temperature (that is still lower than 550° C.) because such an ionizing discharge is a source of ions, photons, and electrons of energy exceeding 2.30 eV.

Since sputter metallization uses DC, RF, with or without a magnetron, induced plasmas erode the cathode that supplies the interconnect material, and glow discharge induced desorption of volatiles is a potential problem that can cause very serious via poisoning problems due to interfacial contamination of the interconnect material within the first seconds of the deposition.

It is possible to detect methane as a desorption product of spin-on glass exposed to a sputter etching step that uses an argon plasma. This molecule is not detected without the exposure to the plasma. Water vapour desorption rate is also affected by the glow discharge exposure.

To show this effect, a sixty (60) minute ex-situ 450° C. $N_2$ ambient outgassing step was carried out in an independent batch apparatus before loading the wafers in the sputtering equipment for a cold (room temperature) argon sputter etch step in the etch chamber of a multi-chamber sputtering equipment. The wafers were then removed from the sputtering equipment and placed in an independent low pressure chemical vapour deposition, LPCVD, apparatus connected with a residual gas analyzer, RGA for mass spectrometry detection of desorption gases.

It is believed that the high energy ions, photons, or electrons of the argon discharge cause methane formation from the decomposition of a larger organic molecule that was chemically bonded to the SOG network or simply trapped in the too small micro-pores of the SOG. The activation energy of the decomposition mechanism was too high to permit its elimination at 450° C. within 60 minutes. According to the graphs in FIG. 1, this activation energy is much larger than 2.07 eV.

Since the two main interconnect material deposition techniques, namely:
1) Sputtering of aluminum alloys, refractory metals, and compounds,
2) Plasma enhanced chemical vapour deposition, PECVD, of tungsten, titanium, titanium nitride, aluminum alloys, or other compounds, all use glow discharges and relatively high wafer temperatures (250° to 500° C.) during metallization, desorption of tightly absorbed volatile products will occur and cause contamination of the interface between interconnect material and the surface on which the interconnection must be done.

This problem is universal and causes high specific via contact resistance problems on small dimension vias. This problem is particularly important when a non etchback spin-on glass process is used since these inorganic or quasi-inorganic materials exposed to the glow discharge are quite porous and are formed from chemical solutions that contain large molecule organic solvents.

This problem is also of increasing importance problem as the diameter of these via is reduced and high temperature metallization processing is used for metallization via step coverage.

There are very many subtle high energy desorption mechanisms that can result during glow discharge exposure. These desorption species can contaminate interfaces and cause specific via contact resistance problems due to interconnect material oxidation or contamination during the first seconds of the metallization by sputtering.

It is necessary to ensure that such desorption occurs before the beginning of the metallization itself. Thermal desorption only, at temperatures not exceeding about 550° C. is not suitable to ensure this; a simultaneous glow discharge exposure, with or without RF bias of the wafer, is necessary.

It is necessary to ensure simultaneous exposure of the wafers to a high enough and controlled temperature and to an intense enough glow discharge to ensure desorption of adsorbed, physically absorbed, as well as chemically absorbed molecules that would desorb during exposure of the wafer to the glow discharge that is used in the metallization process itself.

The wafer temperature must:
1) Exceed 400° C. to ensure substantial chemical desorption of water vapour, organic molecules and any other volatile species that will be formed during this surface preparation step.
2) Exceed by at least 25° C. the highest temperature to which the surface of the wafer will be exposed during the interconnect material deposition process.
3) not exceed 550° C. to minimize hillock growth, junction spiking and films cracking problems.

The glow discharge:
1) Must be induced in such a way that the wafer is bombarded by the formed ions, electrons, or photons.
2) Must be applied for a long enough time to obtain negligible water vapour, organic molecules and any other volatile species desorption rates at the desorption temperature.
3) Be induced from DC, RF, or microwave (ECR) power supplies, and be inductively coupled or use electrodes for its ignition. It is nevertheless preferred that the wafer electrically contact the cathode or a biased electrode to ensure substantial ion bombardment.

Figure 3:
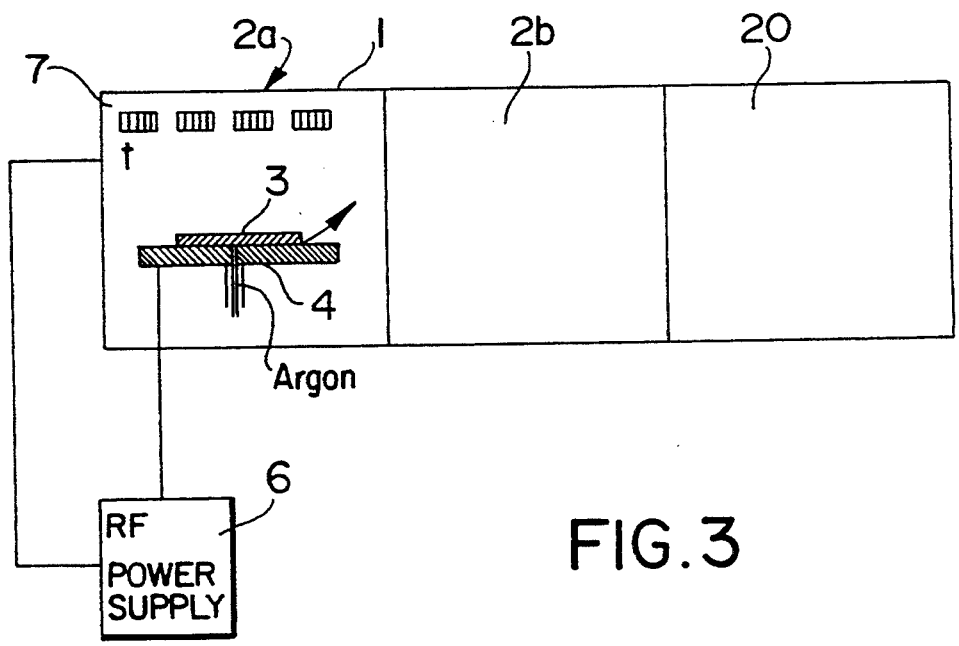
FIG. 3 is a diagrammatic representation of an apparatus for carrying out the method in accordance with the invention.

In a practical example, shown in FIG. 3, a cluster tool 1 is equipped with independent vacuum chambers 2a, 2b, 2c . . . . One of these chambers 2a is dedicated to surface preparation. This ensures complete desorption of the molecules without contaminating the sputtering targets located in other independent chambers.

A single wafer approach has been adopted to ensure very precise control over temperature and glow discharge parameters in the preparation chamber 2a and to ensure high throughput, high uniformity and precisely controlled high temperature and high bias metallization of aluminum alloys and Ti and W containing alloys and compounds. Wafer 3 is mounted on an argon pressurized back side wafer hot plate 4 in the preparation chamber. This ensures a much better thermal contact between the hot plate and the wafer.

A robot (not shown) transfers wafers 3 under vacuum from the preparation chamber 2a to an independent sputtering vacuum chamber 2b of the cluster tool without exposing the wafer to ambient air or any other atmospheric or high pressure ambient that would cause the micro-pores under vacuum to be refilled with this ambient gas.

An RF glow discharge is induced in the preparation chamber 2a from a 13.56 MHz power supply 6 connected in such a way that the anode is connected to the grounded wall of the vacuum chamber. The cathode is connected to the wafer via the argon pressurized back side wafer hot plate 4.

A planar array of permanent magnets 7 in the preparation chamber 2a produces a magnetic confinement field to intensify the glow discharge near the wafer and maximize its electron, photon and ion densities.

The back side argon pressure is adjusted so as to lie between 0.27 to 27 dyn cm$^{-2}$. This ensures efficient heat transfer between the hot plate and the wafer in the preparation chamber. The desorption temperature rise time should be less than 60 seconds, and the wafer should be exposed to the equilibrium desorption temperature for at least 120 seconds.

The chuck temperature is higher than 450° C. but lower than 550° C. in the preparation chamber and exceeds by at least 25° C. the temperature of any other chuck of any other chamber of the cluster tool.

The glow discharge operating pressure is about 0.13 to 27 dyn cm$^{-2}$ of argon in the preparation chamber 2a. The RF power density is about 0.1 to 1.0 W.cm$^{-2}$ in the glow discharge zone located over the wafer in the preparation chamber.

The overall desorption time is less than 200 seconds in the preparation chamber 2a to ensure high throughput.

The described process permits a reduction in the die size of multi-level interconnect devices by reducing via dimensions due to an improved via desorption efficiency, which reduces oxidation of interconnect material and specific contact resistance. It also permits the manufacturing of better yield and more reliable multilevel interconnect CMOS devices and avoids the need for tightly controlled delays between manufacturing steps. The use of tightly controlled dry boxes for the storage of partly processed devices is no longer necessary, and the process flow is improved by reducing constraints.

Although the invention is most applicable to phosphorus alloyed inorganic SOG, it is can be used with benefit in boron, arsenic, lead or other metal alloyed inorganic SOG and combinations of the above, in unalloyed inorganic SOG, in unalloyed quasi-inorganic SOG which incorporate some —CH$_3$, —C$_2$H$_5$ or other organic bonds or combinations of these, and to alloyed quasiorganic SOG which incorporate some organic bonds as well as phosphorus, boron, arsenic, lead or other metal.

Although this technique has been described for inorganic or quasi-inorganic types of dielectrics, it is also applicable to polyimide as a dielectric over the first level of metal interconnect, or any other high temperature (>400° C.) resistant organic dielectric.

The technique is also applicable to porous dielectrics deposited by various chemical vapour deposition techniques at a temperature lower than 500° C.: low pressure chemical vapour deposition of dielectrics, LPCVD, plasma enhanced chemical vapour deposition of dielectrics, PECVD, laser assisted chemical vapour deposition of dielectrics, LACVD, as well as photo enhanced chemical vapour deposition of dielectrics, PhCVD. The technique also applies to sputtered dielectrics as well as dielectrics deposited by electron cyclotron resonance, ECR.

Apart from sputtered interconnect materials, the technique is also applicable to other deposition techniques that use ions, electrons or photons for the deposition of interconnect materials: plasma enhanced chemical vapour deposition of interconnects, laser assisted chemical vapour deposition of interconnects, photo enhanced chemical vapour deposition of interconnects, electron beam evaporation of interconnects and electron cyclotron resonance deposition of interconnects.

The technique is not limited to a cluster tool configuration, in which the high temperature desorption and glow discharge ignition are done in the preparation chamber, but it can also be applied to any single or multi-chamber systems in which in-situ simultaneous desorption and glow discharge exposure is possible before interconnect material deposition, thus preventing wafer re-exposure to ambient air or high pressure gases that would cause the micro-pores to be refilled with ambient molecules.

Although this technique has been described with argon as the back side gas, it also applies to any other inert gas because the heat transfer is more a function of the gas pressure than of the gas identity. Gas mixtures are also possible.

Although this technique was described for single wafer processing, it is possible to use a heating chuck that supports more than one wafers. In that case, the back side gas is injected between each individual wafer and the hot platen, thus insuring a uniform, fast, and well controlled, multi-wafer desorption. The glow discharge in induced over the wafers that sits on the heating platen.

I claim:

1. In a method of fabricating a multilevel semiconductor wafer having a surface that is subjected to a sputtering step at a first temperature, said wafer including a dielectric layer containing volatile components, the improvement wherein immediately prior to carrying out said sputtering step, said wafer is subjected to a desorption step wherein heat is thermally applied to the wafer in an inert ambient and at least a partial vacuum to maintain the wafer at a second temperature, said desporption step being carried out in the presence of a glow discharge at the wafer surface at an RF power density of about 0.1 to 1 Wcm$^{-2}$ such that wafer is bombarded with particles selected from the group consisting of: ions, electrons, and photons; so as to desorb said volatile components with the aid of heat and said glow discharge, and said second temperature being between 400° C. and 550° C. and at least 25° C. higher than said first temperature.

2. The method of fabricating multilevel semiconductor wafers of claim 1, wherein said dielectric layer comprises a spin-on glass planarization layer.

3. The method of claim 2, wherein said glow discharge occurs in a magnetic field arranged to intensify the discharge near the wafer and maximize the particle densities at the wafer surface.

4. The method of claim 1, wherein a RF power frequency of about 13 Mhz is used to create the glow discharge.

5. The method of claim 1, wherein said wafer is placed over a back side hot plate supplying heat thereto, and the glow discharge occurs in argon, the wafer back side pressure being between about 0.27 to 27 dyn cm$^{-2}$ so as to provide efficient heat transfer between the wafer and the hot plate.

6. The method of claim 1, wherein the wafer fabrication occurs in a cluster tool having separate vacuum chambers, the glow discharge desorption takes place in a preparation chamber dedicated to said desorption step, and after desorption the wafer is directly transferred to a sputtering chamber under vacuum.

7. The method of claim 1, wherein the wafers are brought to said second temperature in less than 60 seconds and exposed thereto in equilibrium for at least 120 seconds.

8. The method of claim 9, wherein said glow discharge occurs under a pressure of about 0.13 to 27 dyn cm$^{-2}$ of argon in the preparation chamber.

9. The method of claim 1, wherein only one wafer is subjected to glow discharge desorption at a time so as to permit precise control over temperature and glow discharge parameters.

10. The method of claim 1, wherein the overall desorption time is less than about 200 seconds.

11. The method of claim 1, wherein the spin-on glass is phosphorus alloyed inorganic spin-on glass.

* * * * *